(12) United States Patent
Chen

(10) Patent No.: US 6,200,856 B1
(45) Date of Patent: Mar. 13, 2001

(54) METHOD OF FABRICATING SELF-ALIGNED STACKED GATE FLASH MEMORY CELL

(75) Inventor: Bin-Shing Chen, Hsinchu (TW)

(73) Assignee: Winbond Electronics Corporation, Hsinchu (TW)

( * ) Notice: Subject to any disclaimer, the term of this patent is extended or adjusted under 35 U.S.C. 154(b) by 0 days.

(21) Appl. No.: 09/123,852

(22) Filed: Jul. 28, 1998

Related U.S. Application Data

(60) Provisional application No. 60/079,290, filed on Mar. 25, 1998.

(51) Int. Cl.[7] .................................. H01L 21/8247
(52) U.S. Cl. ................................................. 438/257
(58) Field of Search ......................... 438/257–267

(56) References Cited

U.S. PATENT DOCUMENTS

| | | | |
|---|---|---|---|
| 5,180,680 | * | 1/1993 | Yang . |
| 5,488,586 | | 1/1996 | Madurawe et al. ................. 365/218 |
| 5,595,924 | * | 1/1997 | Yuan et al. . |
| 5,767,005 | * | 6/1998 | Doan et al. ......................... 438/593 |
| 6,008,112 | * | 12/1999 | Acocella et al. .................... 438/593 |

* cited by examiner

Primary Examiner—Richard Booth
(74) Attorney, Agent, or Firm—Townsend and Townsend and Crew LLP

(57) ABSTRACT

A technique for forming an integrated circuit device having a self-aligned gate layer and an overlying stacked gate. The method includes a variety of steps such as providing a substrate (217), which is commonly a silicon wafer. Field isolation regions (201) including a first isolation region and a second isolation region are defined in the semiconductor substrate. A recessed region is defined between the first and second isolation regions. The isolation regions (201) are made using a local oxidation of silicon process, which is commonly called LOCOS, but can be others. A thickness of material (205) such as polysilicon is deposited overlying or on the first isolation region, the second isolation region, and the active region. A step of selectively removing portions of the thickness of material overlying portions of the first isolation region and the second isolation region is performed, where the removing step forms a substantially planar material region in the recessed region. A stacked control gate layer is formed overlying the thickness of material.

8 Claims, 4 Drawing Sheets

METHOD OF FABRICATING SELF-ALIGNED STACKED GATE FLASH MEMORY CELL

This application claims benefit to U.S. provisional Ser. No. 60/079,290 filed Mar. 25, 1998.

BACKGROUND OF THE INVENTION

The present invention relates to semiconductor integrated circuits and their manufacture. The invention is illustrated in an example with regard to the manufacture of a stacked gate "flash" electrically-erasable programmable read only memory ("Flash EEPROM") cell, but it will be recognized that the invention has a wider range of applicability. Merely by way of example, the invention may be applied in the manufacture of other semiconductor devices such as CMOS, microcontrollers, microprocessors, application specific integrated circuits, embedded memory applications, among others.

Industry has used or proposed a variety of memory devices. An example of such a memory device is an erasable programmable read-only memory ("EPROM") device. The EPROM device is both readable, writable, and erasable, i.e., programmable. The EPROM is implemented using a floating gate field effect transistor, which has certain binary states. That is, a binary state is represented by the presence or absence of charge on the floating gate. The charge is generally sufficient to prevent conduction even when a normal high signal is applied to the gate of the EPROM transistor.

A wide variety of EPROMs is available. In a traditional form, EPROMs are programmed electrically and erased by exposure to ultraviolet light. These EPROMs are commonly referred to as ultraviolet erasable programmable read-only memories ("UVEPROM"s). UVEPROMs can be programmed by running a high current between a drain and a source of the UVEPROM transistor while applying a positive potential to the gate. The positive potential on the gate attracts energetic (i.e., hot) electrons from the drain-to-source current, where the electrons jump or inject into the floating gate and become trapped on the floating gate.

Another form of EPROM is the electrically erasable programmable read-only memory ("EEPROM" or "E²PROM"). EEPROMs are often programmed and erased electrically by way of a phenomenon known as Fowler-Nordheim tunneling. Still another form of EPROM is a "Flash EPROM," which is programmed using hot electrons and erased using the Fowler-Nordheim tunneling phenomenon. Flash EPROMs can be erased in a "flash" or bulk mode in which all cells in an array or a portion of an array can be erased simultaneously using Fowler-Nordheim tunneling, and are commonly called "Flash cells" or "Flash devices."

Flash memory cells, however, are often bulky and difficult to fabricate in a desired space due to complex geometries of the multiple gate layers used to form the control and floating gates. Accordingly, flash memory cells generally cannot be integrated as tightly or closely as other types of memory devices. Additionally, flash memory cells often require a high gate coupling ratio to achieve desirable programmability and functionality. High gate coupling ratios are often achieved by way of increasing the surface area of the control gate relative to the floating gate while reducing the surface area of the floating gate that is coupled to the channel region of the memory cell. Unfortunately, it is often difficult to increase the gate coupling ratio without significantly increasing the size of the memory cell.

From the above it is seen that a flash memory cell structure that is relatively easy to fabricate, cost effective, and reliable is clearly desired.

SUMMARY OF THE INVENTION

According to the present invention, a technique including a method and device for the fabrication of an integrated circuit device such as a flash memory is provided. In an exemplary embodiment, the present invention provides a self-aligned stacked gate flash memory device using a novel sequence of fabrication processes. This self-aligned gate reduces the size of the resulting flash memory cell according to certain embodiments.

In a specific embodiment, the present invention provides a method of forming a semiconductor integrated circuit device that has a self-aligned gate structure. The method includes a variety of steps such as forming a plurality of isolation regions in a substrate, which is commonly a silicon wafer. Each of the plurality of isolation regions is defined by a volume of isolation material (e.g., CVD oxide) that is defined in the substrate, and that is defined extending outside the substrate to form a recessed region (e.g., trench) between at least two of the isolation regions. The method also includes a step of forming a thickness of material (e.g., polysilicon) in the recessed region and overlying the isolation regions, where the thickness of material can be defined by a substantially continuous layer overlying and filling the recessed region and overlying the isolation regions. A step of planarizing the thickness of material occurs by removing a portion of the thickness of material overlying the isolation regions to expose an upper surface of the isolation regions to form a substantially planar surface from the thickness of material overlying the recessed region and the isolation regions. The planarizing step forms, for example, a self-aligned floating gate structure from the thickness of material. A control gate is formed over the floating gate to form, for example, a stacked gate structure.

In an alternative specific embodiment, the present invention provides a novel memory integrated circuit, such as a flash memory device, but can be others. The device includes a semiconductor substrate. A first trench isolation region and a second trench isolation region are defined in the semiconductor substrate. The trench isolation regions has an active region defined in a recessed region between the first trench isolation region and the second trench isolation region. A tunnel dielectric layer is defined overlying the active region. The device also includes a self-aligned floating gate layer defined within the recessed region of the active region. To complete the gate structure, a dielectric layer is defined overlying the floating gate layer, and a control gate layer is defined overlying a portion of the floating gate layer to form, for example, a stacked gate structure. The present self-aligned gate structure reduces cell size and improves device integration, as well as other features.

Numerous benefits are achieved using the present invention over preexisting or conventional techniques. In some embodiments, the present invention can provide a smaller cell size that improves device integration using a self-aligned poly-1 process. Additionally, the present invention can use presently available fabrication tools, such as chemical mechanical polishing or planarization, which do not require substantial capital costs if these tools are already available. Furthermore, the invention can prevent misalignment errors in some embodiments using the present self-aligned process. Moreover, gate coupling ratio can also be increased by way of the present self-aligned poly-1 process.

These and other benefits are described throughout the present specification and more particularly below.

The present invention achieves these benefits in the context of known process technology. However, a further understanding of the nature and advantages of the present invention may be realized by reference to the latter portions of the specification and attached drawings.

DETAILED DESCRIPTION OF THE SPECIFIC EMBODIMENTS

Conventional Flash EEPROM Structures

Figure 1:
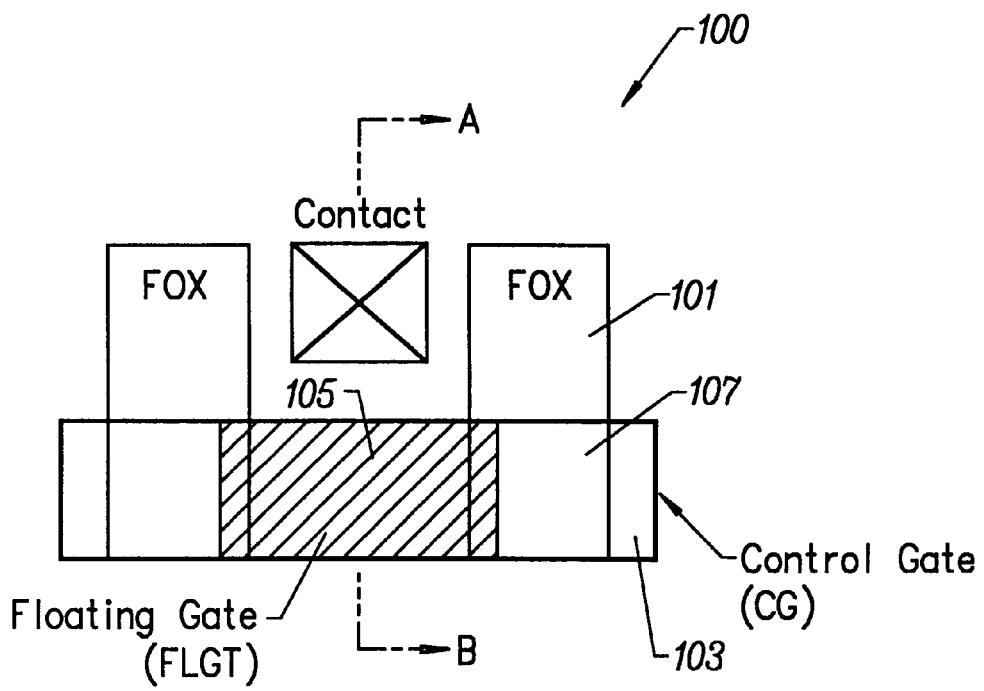
FIGS. 1–2 illustrate simplified diagrams of a conventional stacked gate flash memory cell.
Figure 2:
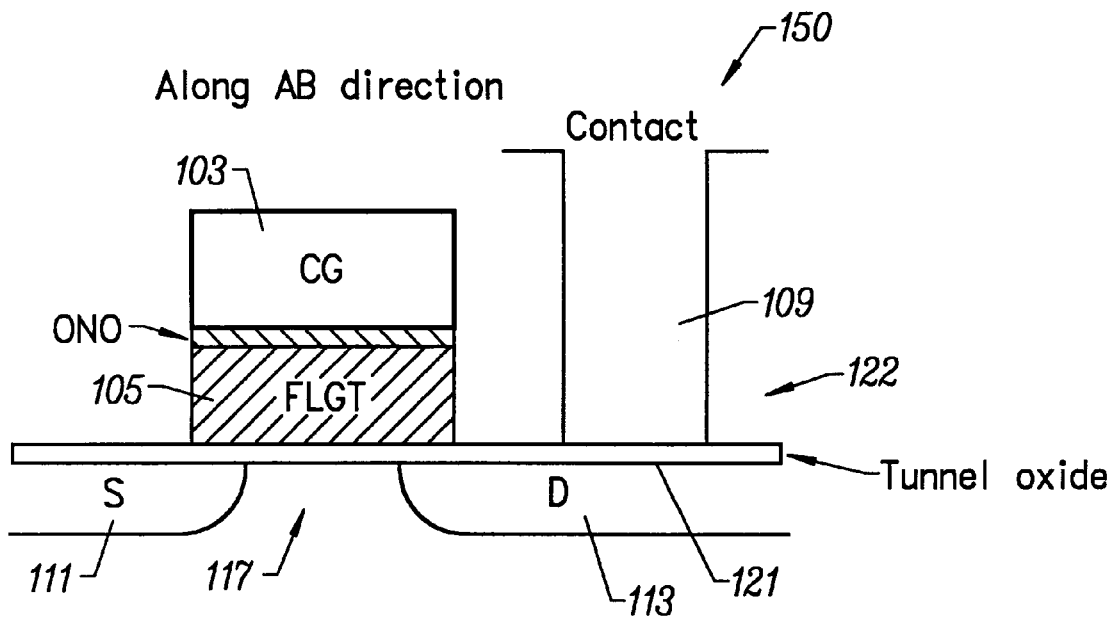
Figure 3:
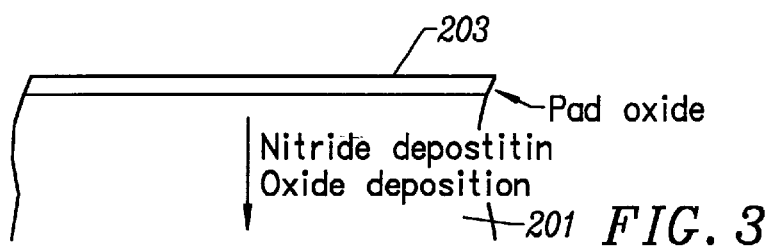
FIGS. 3–14 illustrate a method for fabricating a flash memory cell according to embodiments of the present invention.

FIGS. 1 and 2 illustrate simplified diagrams of a conventional stacked gate flash memory cell. As shown, the diagrams include a top-view or plan view 100 and a side-view or cross-sectional view 150 of the conventional stacked gate flash memory cell. The top-view diagram 100 shows field isolation oxide region(s) 101, which is commonly termed the FOX region. The FOX region separates and/or isolates one cell region from another cell region in the active device region. A flash memory device is defined between the FOX regions. The flash memory device includes a variety of features such as a floating gate 105 that is defined between and overlaps a portion of the FOX regions. A control gate 103 is defined overlying a portion of the floating gate and is defined overlying portions 107 of the FOX regions. A contact 109 to a source/drain region is also shown. The floating gate is made using conventional patterning techniques that form the floating gate structure which overlaps portions 107 of the FOX regions. This conventional floating gate is not self-aligned, and leads to larger cell sizes.

The side-view diagram 150 is made along a cross-section shown along line A to B in FIG. 1. The side-view diagram 150 of the flash memory device includes a substrate 117, which is commonly a semiconductor or silicon substrate. A dielectric layer 121 is defined overlying the top surface of the substrate 117. The dielectric layer 121 is typically called the tunnel oxide layer. A floating gate 105 is defined on the tunnel oxide layer. A transistor source region 111 is defined in the substrate underlying the tunnel oxide layer. A transistor drain region 113 is defined in the substrate underlying the tunnel oxide layer. The drain region 113 is also coupled to the control gate layer 103. A contact region 109 is defined overlying the drain region 113 in the dielectric layer 122. Interdielectric layer 122 is defined overlying the transistor structures including portions of the control gate layer, the floating gate layer, FOX regions, and other transistor regions.

The above flash device is erased by Fowler-Nordheim tunneling of electrons. For example, selected voltages are applied to the $V_D$, $V_S$, and $V_{CG}$ to inject electrons through the edge of the floating gate to the source. The floating gate thereby becomes relatively more positively charged. This shifts the threshold voltage in the negative direction so that in the READ mode the transistor will be "on." In the program mode the control gate is at a high voltage while a fixed voltage is applied to the drain junction to generate hot electrons. These hot electrons have sufficient energy to overcome the oxide barrier and enter into the floating gate. The threshold voltage thereby shifts in the positive direction so that in the read mode the transistor will be "off." Typically, the erased state corresponds to a logical "1" stored in the cell, and the programmed state corresponds to a logical "0" stored in the cell. Of course, in particular implementations, the reverse notational convention can also be used such that an erased state corresponds to a logical "0" and a programmed state corresponds to a logical "1".

Numerous limitations exist in this conventional cell structure. As line widths become smaller, it becomes advantageous to reduce cell size. Cell size, however, is often limited by the size of the control gate layer, which should be sufficiently large to increase the gate coupling ratio of the flash device. Gate coupling ratio can be defined according to the simplified expression:

Gate Coupling Ratio $C_{ono}/(C_{tox}+C_{ono})$ where $C_{ono}$ is capacitance of the oxide/nitride/oxide; and $C_{tox}$ is capacitance of the tunnel oxide.

As shown in the above expression, gate coupling ratio ("GCR") is generally increased by decreasing the thickness of the tunnel oxide layer, which reduces capacitance of such layer. Unfortunately, it is generally impossible to maintain effective device performance having a decreased tunnel oxide thickness for some conventional devices. Additionally, the geometric configuration of the conventional device limits the relative area of the tunnel oxide layer to the ONO layer.

Accordingly, GCR simply cannot be adjusted in an easy and cost effective manner. Some manufacturers have attempted to provide different geometric configurations from the conventional device shown by FIGS. 1 and 2, but such configurations often come with additional expense or limitation in processing the device.

Present Device Methods and Structures

A method according to an embodiment of the present invention is briefly outlined as follows:

1. Provide semiconductor substrate;
2. Form well(s);
3. Form pad oxide on substrate;
4. Form nitride layer on pad oxide;
5. Form oxide on nitride layer;
6. Pattern oxide and nitride layers;
7. Form trenches in substrate;
8. Form oxide in trenches;
9. Perform field implant;
10. Deposit CVD oxide;
11. Planarize CVD oxide;
12. Remove patterned nitride layer;
13. Remove pad oxide layer;
14. Perform high voltage implant;
15. Form gate dielectric layer;
16. Deposit gate layer (i.e., poly-1) on dielectric layer;
17. Dope gate layer;
18. Planarize gate layer;
19. Mask gate layer;
20. Pattern gate layer;
21. Form oxide layer via etchback;
22. Deposit spacer layer (i.e., poly-2);
23. Form spacer on gate layer;
24. Form oxide-on-nitride-on-oxide (i.e., ONO);

25. Deposit control gate layer (i.e., poly-3);
26. Mask control gate layer;
27. Define control gate;
28. Perform remaining fabrication steps, as necessary.

The above sequence of steps shows a novel method of forming a stacked gate structure using a self-aligned gate process according to an embodiment of the present invention. These sequences of steps provides numerous benefits such as the self-aligned stacked gate structure, as well as others. The steps are merely an illustration and should not limit the scope of the claims herein. One of ordinary skill in the art would recognize other variations, alternatives, and modifications. Details of the above steps are shown by way of the Figs. below.

FIGS. 3–14 illustrate a method for fabricating a memory cell according to embodiments of the present invention, using cross-sectional and top-view diagrams. These diagrams are merely illustrations and should not limit the scope of the claims herein. One of ordinary skill in the art would recognize other variations, modifications, and alternatives. The present method begins by forming an oxide layer 203, commonly termed pad oxide, overlying a top surface of a semiconductor substrate 201, which is often made of silicon, but can be other materials as well. The pad oxide is generally formed by a steam or wet oxidation process using, for example, an annealing furnace. The pad oxide layer often has a thickness of less than about 0.05 micron, but can be at other thicknesses. Other types of materials can also be used instead of oxide for this layer.

Figure 4:
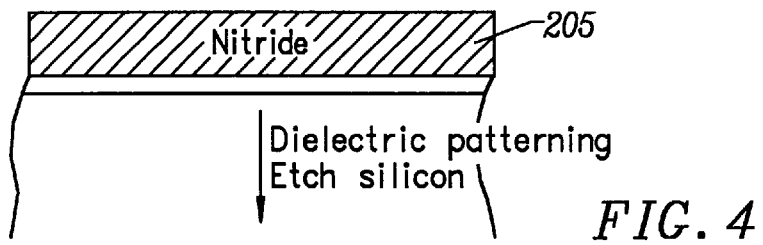

A masking layer 205 is defined overlying the pad oxide layer, as shown in FIG. 4. The masking layer 205 can be made of any suitable material that can withstand subsequent etching processes to be performed. In a specific embodiment, the masking layer material is a silicon nitride layer. The silicon nitride layer can be made using a variety of techniques such as chemical vapor deposition ("CVD"), plasma enhanced chemical vapor deposition ("PECVD"), and others. The silicon nitride layer is generally about 0.1 microns or greater, but is not limited to this thickness.

Figure 5:
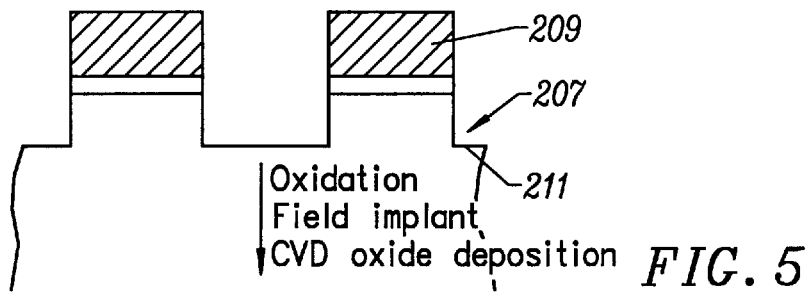

The masking layer is patterned, as shown in FIG. 5. The patterned masking layer can be patterned using a variety of techniques, including photolithography. The patterned layer forms exposed regions or openings overlying portions of the pad oxide or substrate. A step of etching occurs to remove portions of the exposed pad oxide and portions of the substrate. The etching is generally anisotropic which is substantially directional in nature. Etching can take place using techniques such as plasma etching, reactive ion etching, and other processes. These techniques can be dry as well as wet. The etching step also forms substantially vertical trenches in the substrate. A typical trench includes an opening 207, sides, and a bottom region 211. Other embodiments, the bottom region 211 in each of the trenches have substantially a same or similar depth.

Figure 6:
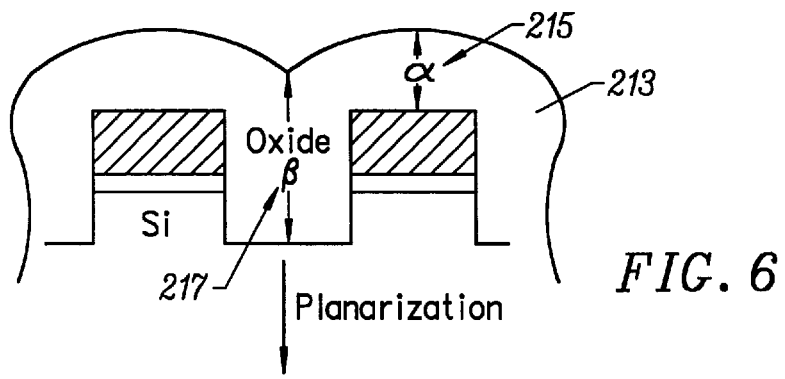

The method then performs a step of depositing a layer of dielectric material overlying the trenches and the patterned masking layer, as shown in FIG. 6. In particular, the dielectric layer overlies the bottom region, and the sides 209 and fills the opening 207 of each of the trenches. Unfortunately, most dielectric layer processes are not completely self-planarizing. Accordingly, the dielectric layer often has a portion 215 that is lower ($\beta$) (but thicker) overlying the bottom region of the trench than a portion 215 ($\alpha$) of the dielectric layer overlying the patterned masking layer. The dielectric layer can be made of any suitable material such as borophosphosilicate glass ("BPSG"), phosphosilicate glass ("PSG"), CVD oxide, fluorinated glass ("FSG"), as well as other dielectric materials.

Figure 7:
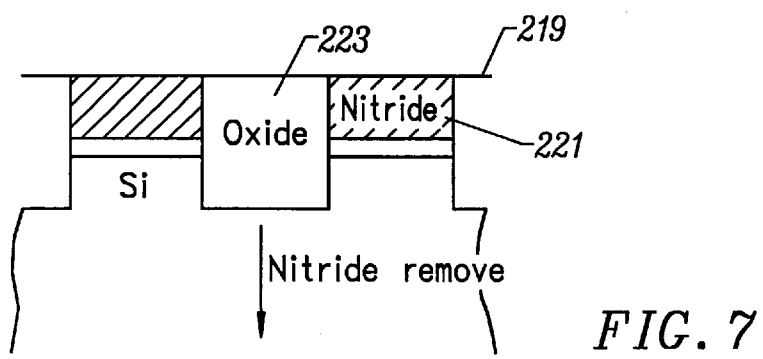

A planarizing step is used to remove portions of the dielectric layer to create isolation region(s) 233, as shown in FIG. 7. The isolation region has an upper surface 219 that is substantially even with the upper surface 221 of the patterned masking layer. Accordingly, the top surface of the partially completed device is substantially even in shape or geometry. The planarizing step often uses techniques such as chemical mechanical polishing or planarization. Chemical mechanical polishing or planarization, commonly referred as CMP, is a technique of polishing materials including semiconductor substrates and films overlying such substrates, which provides a high degree of uniformity and planarity. The process is used to remove high elevation features on films such as those portions of the dielectric layer on the isolation regions. Chemical mechanical polishing uses an apparatus having a single large polishing pad positioned on a platen, against which a substrate is positioned for polishing. A positioning member positions and biases the substrate to be polished against the polishing pad, which is rotating. A chemical slurry, which is likely to have abrasive materials, is maintained on the polishing pad to modify the polishing characteristics of the polishing pad and to enhance the polishing of the substrate or films.

In a specific embodiment, the chemical mechanical polishing process uses a selected recipe. The polishing process selectively removes the dielectric material without damaging or removing the patterned masking layer. This recipe uses a slurry including an abrasive material such as a silica material. A solution such as KOH is mixed with the abrasive material. The polishing pad is pressed against the dielectric layer to remove portions of the dielectric layer while leaving a substantially planarized layer defined in the trench. As shown, the substantially planarized layer has the same or similar height as the height of the masking layer. In other embodiments, the height of the substantially planarized layer is lower or even higher, but depends upon the application. By way of the trench forming process and planarizing process, a self-aligned layer of isolation material is defined.

Figure 8:
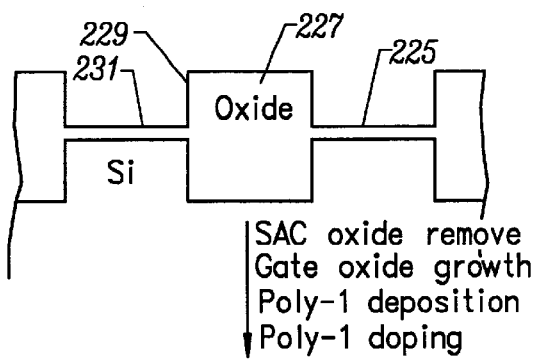

A selective etching process removes the patterned masking layer, as shown in FIG. 8. The selective etching process selectively removes the patterned masking layer without damaging or etching the isolation material 227 and/or the pad oxide layer 231. The etching process substantially removes the patterned masking layer without leaving any residual material on the isolation material 227 and/or the pad oxide layer 231. The etching process can be any suitable selective etching technique, including dry and/or wet processes. In an embodiment, the etching process is a wet etch process using solutions such as $H_3PO_4$, but can also be others.

The pad oxide or "sacrificial oxide" is removed and a clean layer of gate dielectric material is grown overlying exposed substrate regions. The gate dielectric material is an oxide, which is commonly termed gate oxide. The gate oxide is often grown using a thermal oxidation technique or steam oxidation technique. Alternatively, the gate oxide can be replaced by other materials. These materials include silicon oxynitride, silicon nitride, and others. Additionally, multiple layers can be used as the gate dielectric layer.

In preferred embodiments, the gate dielectric is a "tunnel dielectric" layer. The tunnel dielectric layer is formed overlying the surface of the semiconductor substrate. In particular, the dielectric layer is defined within the active region between the isolation regions, which are shown by the protruding isolation material 227. The active region is generally within the trench between the two isolation regions, as shown. The tunnel dielectric layer is often made of a high quality oxide such as thermal oxide or the like. The dielectric layer can also be made of multiple layers as well as materials such as silicon oxynitrides, silicon nitride, and other materials.

Figure 9:
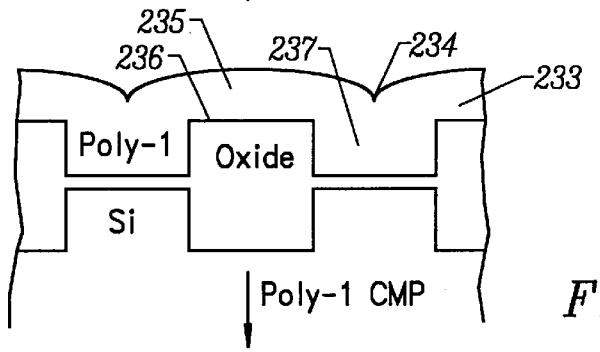

A polysilicon layer 233 is formed overlying the gate dielectric layer and isolation regions, as shown in FIG. 9. As shown, the polysilicon layer 237 has a relatively consistent thickness and rests overlying the recessed region and the field isolation regions 235. Region 234 of the polysilicon layer is generally higher than region 236 of isolation. The polysilicon layer is often a thickness of material deposited using a variety of techniques. In some embodiments, the polysilicon layer is defined at low temperature in an amorphous state, which is later crystallized. Alternatively, the polysilicon layer is formed in the polycrystalline state. The polysilicon layer can be doped using diffusion (e.g., $POCl_3$), in-situ doping (e.g., $PH_3$), and ion implantation. In an embodiment using a design rule of about 0.5 micron or less, the thickness of the polysilicon layer is about 0.15 micron or less. The thickness generally does not matter in most embodiments due to the subsequent planarizing steps.

Figure 10:
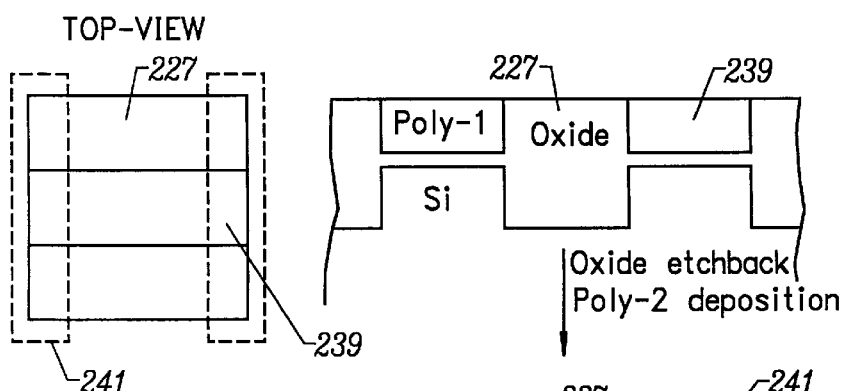

A planarizing step is performed to remove protruding portions of the polysilicon layer, as shown in FIG. 10. FIG. 10 shows both side-view and top-view illustrations. The planarizing step often uses techniques such as chemical mechanical polishing or planarization. Chemical mechanical polishing or planarization, commonly referred as CMP, is a technique of polishing materials including semiconductor substrates and films overlying such substrates, which provides a high degree of uniformity and planarity. The process is used to remove high elevation features on films such as those portions of the polysilicon layer on the isolation regions. Chemical mechanical polishing uses an apparatus having a single large polishing pad positioned on a platen, against which a substrate is positioned for polishing. A positioning member positions and biases the substrate to be polished against the polishing pad, which is rotating. A chemical slurry, which is likely to have abrasive materials, is maintained on the polishing pad to modify the polishing characteristics of the polishing pad and to enhance the polishing of the substrate or films.

In a preferred embodiment, the chemical mechanical polishing process uses a selected recipe. This recipe uses a slurry including an abrasive material such as a silica material. A solution such as KOH mixed with the abrasive material. The polishing pad is pressed against the polysilicon layer to remove portions of the polysilicon layer while leaving a substantially planarized layer defined in a recessed region between the isolation regions. As shown, the substantially planarized layer has the same or similar height as the height of the isolation regions. In other embodiments, the height of the substantially planarized layer is lower or even higher, but depends upon the application. By way of the polysilicon forming process and planarizing process, a self-aligned layer of polysilicon material is defined.

Figure 11:
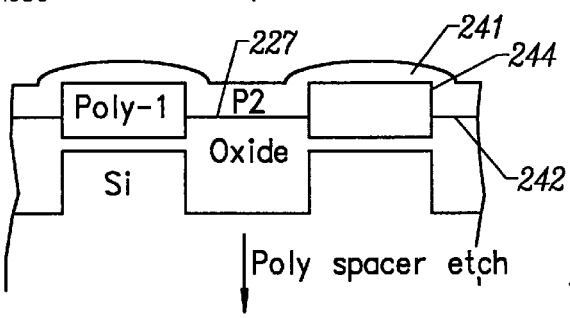

The method undergoes a step of etching back exposed portions of oxide layer 227, as shown in FIG. 11. The etch back step selectively removes portions of the oxide layer to expose a portion of an edge or edges 244 of the patterned poly-1 layer. In a specific embodiment, the portion of the edge exposed is about 20 percent or more of the total thickness of the poly-1 layer. Alternatively, the portion of the edge exposed is about 20 percent or more of the total thickness of the poly-1 layer. As shown, the edge is often substantially vertical in shape, but can also have slight angles, depending upon the application. Any oxide is cleared from the exposed poly-1 layer. A spacer layer 241 (or poly-2) is deposited overlying the surface of the etched oxide layer 242 and poly-1 layer including edges. The spacer layer can be made of a variety of materials but is preferably polysilicon. The polysilicon layer is often a thickness of material deposited using a variety of techniques. In some embodiments, the polysilicon layer is defined at low temperature in an amorphous state, which is later crystallized. Alternatively, the polysilicon layer is formed in the polycrystalline state. The polysilicon layer can be doped using diffusion (e.g., $POCl_3$), in-situ doping (e.g., $PH_3$), and ion implantation. In an embodiment using a design rule of about 0.5 micron or less, the thickness of the polysilicon layer is about 0.3 micron or less.

Figure 12:
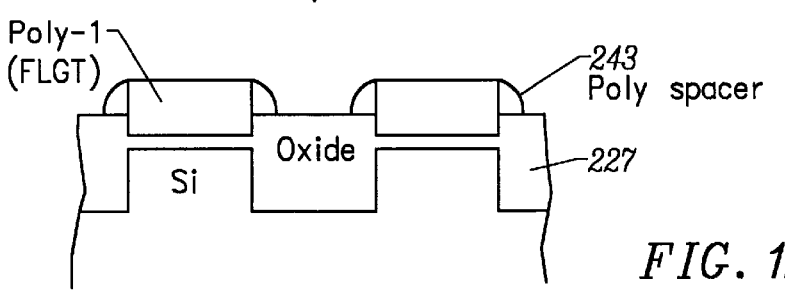

Sidewalls spacers 243 are defined on edges of the exposed regions of the poly-1 layer, as shown in FIG. 12. The spacers also sit on the oxide layer 227. The sidewall spacers are formed using an etching process. The etching process is often an anisotropic etching process such as plasma etching, ion milling, or reactive ion etching. In most embodiments, the sidewall spacers are conductive and connect to the poly-1 layer. Accordingly, it is the combination of the sidewall spacers and the poly-1 layer that define the floating gate in, for example, the flash memory structure.

Figure 13:
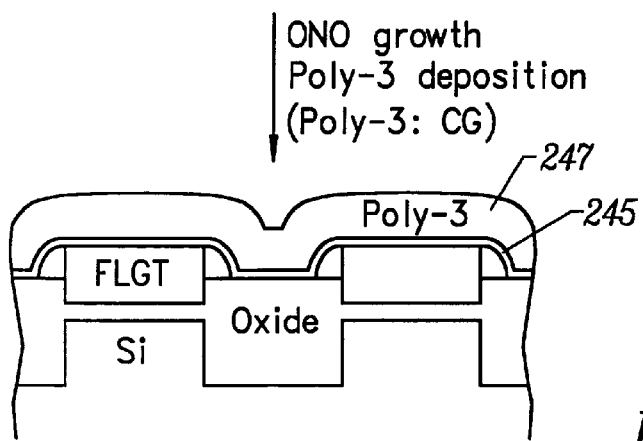

An insulating layer 245 is defined overlying the sidewall spacers and the poly-1 layer, as shown in FIG. 13. In particular, an oxide layer is defined overlying the first polysilicon layer and sidewall spacers. In a specific embodiment, the present invention uses a furnace oxidation process that relies upon steam oxidation to form a dielectric layer such as the oxide layer. A thin nitride layer is deposited overlying the oxide layer. A subsequent oxide layer can be deposited overlying the nitride layer. The combination of the oxide/nitride/oxide is commonly termed ONO. Of course, the type of dielectric layer used depends upon the application.

Figure 14:
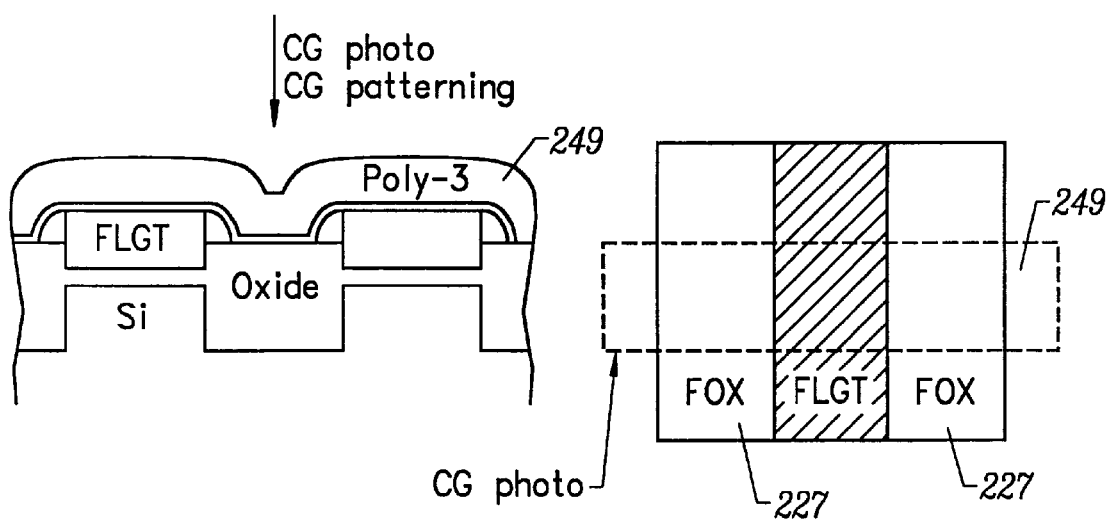

A third polysilicon layer or control gate layer 247 is defined overlying the surface of the structure. The polysilicon layer is often a thickness of material deposited using a variety of techniques. In some embodiments, the polysilicon layer is defined at low temperature in an amorphous state, which is later crystallized. Alternatively, the polysilicon layer is formed in the polycrystalline state. The polysilicon layer can be doped using diffusion (e.g., $POCL_3$), in-situ doping (e.g., $PH_3$), and ion implantation. The third polysilicon layer is defined using masking and etching steps, as shown in FIG. 14. The top-view diagram shows the control gate 249 that intersects the floating gate, including poly-1 and sidewall spacers.

GCR is increased by way of the present invention. As shown in the above Figs., the portion of the floating gate coupled to the channel region includes a portion of poly-1 and not the sidewall spacers. This portion is smaller in surface area than the portion of the floating gate, including poly-1 and the sidewall spacers, that is coupled to the control gate. Accordingly, GCR is increased by way of the smaller surface area of the floating gate that is coupled to the channel region than the surface area of the floating gate that is coupled to the control gate. Additionally, the floating gate is defined within the field oxide regions by way of a self-aligned process, which reduces the area of the floating gate, to provide a smaller cell design, thereby improving device integration.

While the above is a full description of the specific embodiments, various modifications, alternative constructions and equivalents may be used. For example, specific dimensions are discussed above for the specific embodiments. But of course, these dimensions may depend on the particular application. Therefore, the above description and illustrations should not be taken as limiting the scope of the present invention which is defined by the appended claims.

What is claimed is:

1. A method of forming a semiconductor integrated circuit device, said method comprising:

forming a first isolation structure and a second isolation structure on a semiconductor substrate, said isolation structures having an active region defined in a recessed region between said first isolation structure and said second isolation structure;

forming a control gate layer overlying said active region;

forming a first thickness of material overlying said first isolation structure, said second isolation structure, and said active region, wherein said thickness of material substantially fills said recessed region;

selectively removing portions of said thickness of material overlying portions of said first isolation structure and said second isolation structure leaving a substantially planar material region in said recessed region to define a floating gate, said substantially planar material region being self-aligned into said recessed region;

forming a second thickness of material overlying and contacting said substantially planar material region which defines said floating gate; and forming a dielectric layer overlying said self aligned material region and said second thickness of material, wherein said thickness of material fills at least 75 percent of said recessed region.

2. A method of forming a semiconductor device, comprising:

forming a first isolation region and a second isolation region on a semiconductor substrate, said isolation regions having an active region defined in a first recessed region between said first isolation region and said second isolation region, wherein said first and second isolation regions each includes an insulating structure;

forming a thickness of material overlying said first isolation region, said second isolation region, and said active region;

selectively removing portions of said thickness of material overlying portions of said first isolation region and said second isolation region, so that said first and second isolation regions are substantially free of said thickness of material;

etching a portion of said insulating structure in each of said first and second isolation regions to define a second recessed region;

forming a dielectric layer overlying said thickness of material; and forming a control gate layer overlying said dielectric layer.

3. The method of claim 2 wherein said thickness of material is deposited overlying said active region to substantially fill said first recessed region.

4. The method of claim 3 wherein said thickness of material is selectively removed to provide a substantially planar material region in said first recessed region.

5. A method of forming a semiconductor device comprising:

forming a plurality of isolation regions, wherein each of said plurality of isolation regions includes an isolating structure;

forming a plurality of active regions, wherein each active region is defined in a recessed region between two isolation regions;

forming a first conductive material overlying said plurality of isolation regions and said plurality of active regions, wherein said first conductive material substantially fills said recessed regions defining said active regions;

removing said first conductive material overlying said plurality of isolation regions while leaving at least a portion of said first conductive material within each of said recessed regions, so that each of said portions of said first conductive material within each of said recessed regions are isolated from each other;

forming a dielectric layer overlying said active regions;

forming a control gate layer overlying said dielectric layer etching a portion of each of said isolating structures after said removing step;

forming a second conductive material overlying said etched isolating structures; and selectively removing said second conductive material overlying said isolating structures, so that a portion of said second conductive material coupled to said first conductive material remains on said isolating structures to form a conductive spacer.

6. The method of claim 5 wherein an upper surface of said portions of said first conductive material left within each of said recessed regions is at higher point than an upper surface of each of said etched isolating structures.

7. A method of forming a non-volatile memory device, comprising:

forming first, second, and third isolation regions having first, second, and third isolating structures, respectively;

defining first and second active regions between said first and second isolation regions and said second and third isolation regions, respectively, wherein said first and second active regions include a first recessed region and a second recessed region, respectively;

forming a floating gate material overlying said isolation regions and said active regions, said floating gate material overlying said isolation regions defines a first portion of said floating gate material and said floating gate material overlying said active regions defines a second portion of said floating gate material;

removing a portion of said floating gate material, wherein said first portion of said floating gate material are substantially removed while leaving at least a portion of said second portion of said conductive material overlying the active regions to define a floating gate;

etching a portion of said isolating structures;

forming a conductive spacer material overlying said etched isolating structures;

selectively removing said conductive spacer material to define a conductive spacer joined to said floating gate;

forming a dielectric layer overlying said floating gate and said conductive spacer; and forming a control gate material overlying said dielectric layer.

8. The method of claim 7 wherein said floating gate is provided over a tunnel oxide layer and said dielectric layer is an ONO layer, wherein said conductive spacer joined to said floating gate increases gate coupling ratio which is defined as;

Gate Coupling Ratio $C_{ono}/(C_{tox}+C_{ono})$ where $C_{ono}$ is capacitance of the oxide/nitride/oxide; and $C_{tox}$ is capacitance of the tunnel oxide.

* * * * *